United States Patent [19]

Payne

[11] Patent Number: 4,716,500
[45] Date of Patent: Dec. 29, 1987

[54] PROBE CABLE ASSEMBLY

[75] Inventor: David G. Payne, Aloha, Oreg.

[73] Assignee: Tektronix, Inc., Beaverton, Oreg.

[21] Appl. No.: 789,278

[22] Filed: Oct. 18, 1985

[51] Int. Cl.⁴ .......................................... H05K 1/00
[52] U.S. Cl. ................................. 361/398; 174/24; 174/68.5; 174/117 PC; 333/1; 361/414; 439/67; 439/502
[58] Field of Search ................. 361/397–398, 361/400–401, 408, 413–414; 324/158 P, 158 F; 339/17 F, 17 CF, 108 TP, 176 MF, 28; 174/24, 117 FF, 117 F, 117 PC, 68.5; 333/1; 439/67–68, 476, 492, 476

[56] References Cited

U.S. PATENT DOCUMENTS

| | | | |
|---|---|---|---|
| 2,854,502 | 9/1958 | Richter | 339/17 F |
| 2,961,629 | 11/1960 | Kamm | 339/17 F |
| 3,114,587 | 12/1963 | Herrmann | 339/17 F |
| 3,221,095 | 11/1965 | Cook | 339/17 F |
| 3,391,246 | 7/1968 | Freeman et al. | 174/117 FF |
| 3,462,542 | 8/1969 | Richter | 339/17 F |
| 3,516,156 | 6/1970 | Steranko | 361/414 X |
| 3,568,000 | 3/1971 | Versailles | 361/414 X |
| 3,586,757 | 6/1971 | Haldeman, Jr. et al. | 174/117 FF |
| 3,703,604 | 11/1972 | Henschen et al. | 174/117 FF X |
| 3,798,762 | 3/1974 | Harris et al. | 174/68.5 X |
| 4,018,491 | 4/1977 | Niedwiecke et al. | 339/176 MF |
| 4,248,491 | 2/1981 | Mouisse | 339/176 MF X |
| 4,353,040 | 10/1982 | Krumm et al. | 331/1 |
| 4,514,022 | 4/1985 | Payne | 324/158 X |
| 4,561,709 | 12/1985 | Fukukura | 339/17 F |

FOREIGN PATENT DOCUMENTS

| | | | |
|---|---|---|---|
| 2424442 | 11/1975 | Fed. Rep. of Germany | 174/117 FF |
| 55-148436 | 11/1980 | Japan | 324/158 F |
| WO80/00389 | 3/1980 | PCT Int'l Appl. | 174/117 F |
| 1356143 | 6/1974 | United Kingdom | 339/17 F |
| 2034102 | 5/1980 | United Kingdom | 174/117 F |

OTHER PUBLICATIONS

Ferraro, A. J., Larnerd, J. D., Zucconi, T. D., "PC Cable with Epoxy Glass Substrate," IBM Tech. Discl. Bul., vol. 20, No. 8, Jan. 1978.

Auletta, L. V., Marks, R., "Flexible Tape Conductor Interconnection for Chips", IBM Tech. Discl. Bul., vol. 24, No. 2, Jul. 1981.

Primary Examiner—A. T. Grimley
Assistant Examiner—Jane K. Lau
Attorney, Agent, or Firm—John Smith-Hill; Francis I. Gray

[57] ABSTRACT

A probe cable assembly for use in connecting a monitoring instrument to an electronic SUT, to analyze the interaction between the system and a multiple terminal electronic component which can be fitted in a receptacle of the system, comprises a flexible circuit cable having an instrument end and a probe end. The cable comprises at least a first group of conductors that terminate at the probe end of the cable in respective termination areas in a predetermined array. The termination areas are exposed to one side of the cable and form respective terminals for the conductors. The cable assembly also comprises a stiffening element attached to the cable at its probe end at the opposite side of the cable. The stiffening element is capable of fitting in the receptacle of the SUT. When the stiffening element is fitted in the receptacle of the SUT, the termination areas of the conductors make direct pressure contact with the terminals in the receptacle of the SUT.

8 Claims, 6 Drawing Figures

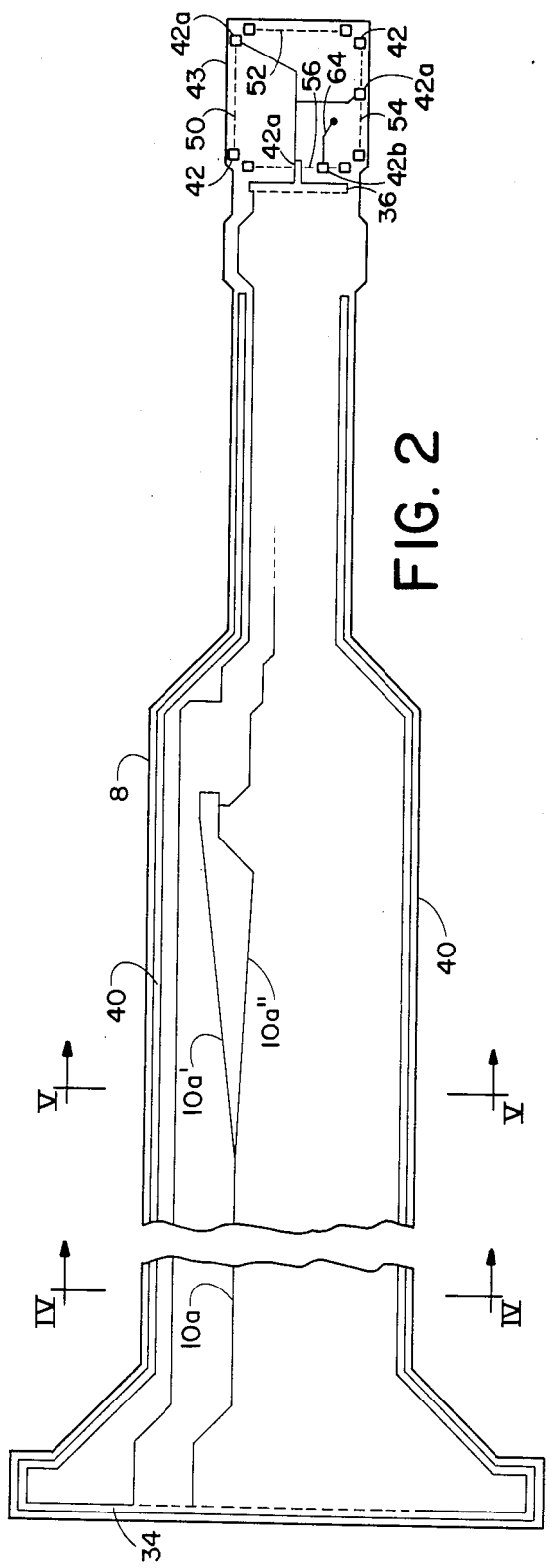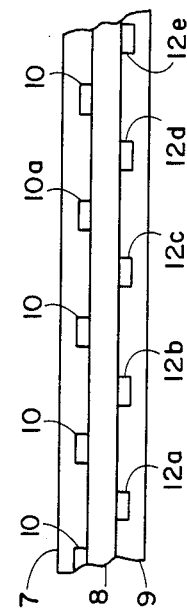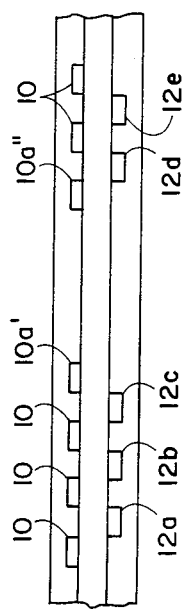

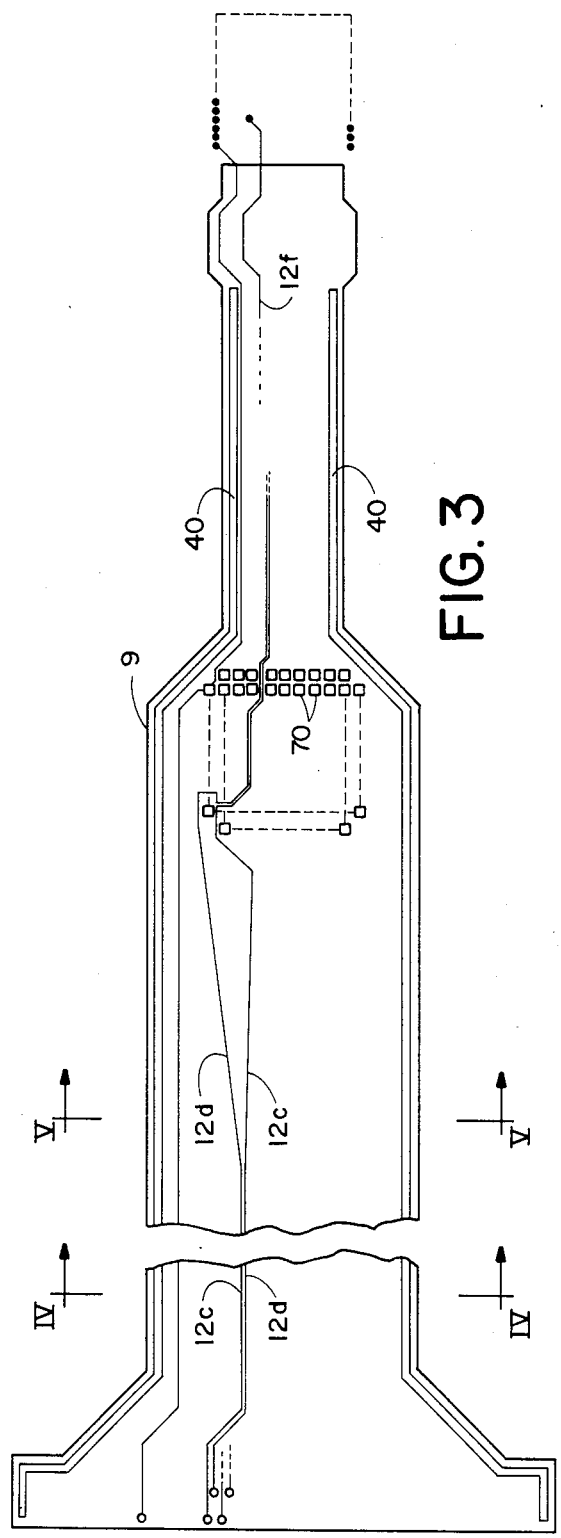
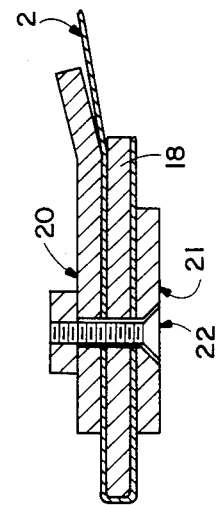

PROBE CABLE ASSEMBLY

This invention relates to a probe cable assembly.

BACKGROUND OF THE INVENTION

It is well known to use a logic analyzer in the design of a microprocessor-based system. A conventional logic analyzer is used to display the system's response to various operations performed by the microprocessor, and to change the mode of operation of the microprocessor. The microprocessor interfaces with the logic analyzer through a personality module. Conventionally, the personality module has a probe cable which connects the module to the system under test (SUT), by way of the microprocessor's connection terminals. Recent microprocessors have as many as 68 closely spaced terminals, and it is extremely difficult to establish separate connections to the 68 different terminals.

Recently, microprocessors have been packaged on leadless chip carriers. A leadless chip carrier (described in JEDEC Standard MS-002) is a ceramic substrate with a pattern of planar contact pads flush with its underside. The substrate, with one or more integrated circuit (IC) chips mounted thereon and having their terminals connected to the contact the substrate, is fitted in a socket, or receptacle, which is provided with terminals that engage the contact pads and provide electrical connections between the ICs and other circuitry. The socket is designed to receive the chip carrier only, and it is not possible to introduce a probe into the socket without removing the chip carrier, or to replace the chip carrier in the socket if a probe is present therein.

A logic analyzer may be used to carry out in circuit testing of a microprocessor, i. e. monitoring of electrical events with the microprocessor connected as part of a microprocessor-based system and without the logic analyzer affecting operation of the SUT. In order to carry out in circuit testing of a microprocessor packaged on a leadless chip carrier in accordance with JEDEC standard MS002, a probe element must be fitted in the SUT's microprocessor socket and provision made elsewhere for accommodating the microprocessor itself. To facilitate making connections to all the terminals of the socket, the probe element would normally be of the same physical dimensions as the chip carrier.

U.S. Pat. No. 4,514,022 discloses a probe cable assembly which allows the microprocessor to be removed from the SUT and provides for both the personality module and the microprocessor to be connected to the SUT through the system's microprocessor socket, or receptacle. The probe cable has an instrument end, at which it is connected to the logic analyzer's personality module, and a probe end. A probe element is secured to the cable at the probe end, and is capable of fitting in the microprocessor socket of the SUT. The cable also comprises an auxiliary receptacle for receiving the microprocessor. The auxiliary receptacle has connection pins extending from its underside for connecting the microprocessor to other circuitry. The cable is formed from a flexible circuit board having three distinct portions, namely a main body portion and two leg portions. The auxiliary receptacle is carried on the main body portion with its connection pins projecting through the main body portion. A first of the leg portions has connection pads arranged in an array corresponding to that of the connection pins of the auxiliary receptacle, and is folded under the main body portion so as to bring its connection pads into contact with the connection pins of the auxiliary receptacle. The second leg portion carries a probe element that is configured to fit in a socket identical to the auxiliary receptacle, and is also folded under the main body portion so as to bring the probe element into position under the probe end of the main body portion. Signal conductor runs extend from the instrument end of the cable assembly to the connection pads on the first leg portion and to the auxiliary receptacle, and from the auxiliary receptacle to both the probe element and the probe end of the flexible circuit board. In one commercially-manufactured embodiment of the probe cable assembly, the flexible circuit board also has a ground plane comprising a single sheet of copper. Where the leg portions of the probe cable assembly are folded under the main body portion, there may be as many as four thicknesses of flexible circuit superimposed over one another. This results in the signal conductor runs being of non-uniform impedance along their length, and in electrical interaction among the different conductor runs. Moreover, the flexible circuit board is rendered quite stiff in places, making manipulation of the probe end inconvenient.

In addition, in the prior probe cable assembly the contact pads of the probe element are connected to the runs of the cable by soldering, and these solder joints are subject to failure on repeatedly inserting the probe element into, and removing it from, the SUT's microprocessor socket.

SUMMARY OF THE INVENTION

In a preferred embodiment of the invention in its first aspect, a circuit board comprises a sheet of dielectric material having first and second main faces, and first and second arrays of discrete conductor runs supported on the first and second main faces respectively of the sheet of dielectric material. The conductor runs of the first and second arrays extend in a generally common direction over a substantial portion of the length of the two arrays. The two arrays are in interlaced relationship, whereby each conductor run of the second array is substantially equidistant from two conductor runs of the first array over that portion of the length of the arrays for which they extend in a generally common direction.

In a preferred embodiment of the present invention in its second aspect, a probe cable assembly for use in connecting a monitoring instrument to an electronic SUT, to analyze the interaction between the system and a multiple terminal electronic component which can be fitted in a receptacle of the system, comprises a flexible circuit cable having an instrument end and a probe end. The cable comprises at least a first group of conductors that terminate at the probe end of the cable in respective termination areas in a predetermined array. The termination areas are exposed to one side of the cable and form respective terminals for the conductors. The cable assembly also comprises a stiffening element attached to the cable at its probe end at the opposite side of the cable. The stiffening element is capable of fitting in the receptacle of the SUT. When the stiffening element is fitted in the receptacle of the SUT, the termination areas of the conductors make direct pressure contact with the terminals in the receptacle of the SUT.

BRIEF DESCRIPTION OF THE DRAWINGS

For a better understanding of the invention, and to show how the same may be carried into effect, reference will now be made, by way of example, to the accompanying drawings in which:

FIG. 2 is a plan view of one array of conductor runs of the FIG. 1 probe cable assembly, FIG. 3 is a plan view of the other array of conductor runs of the FIG. 1 probe cable assembly, FIG. 4 is a partial sectional view along the line IV—IV in FIGS. 2 and 3, FIG. 5 is a partial sectional view along the line V—V of FIGS. 2 and 3, and FIG. 6 is a sectional view along the line VI—VI of FIG. 1.

DETAILED DESCRIPTION

Figure 1:
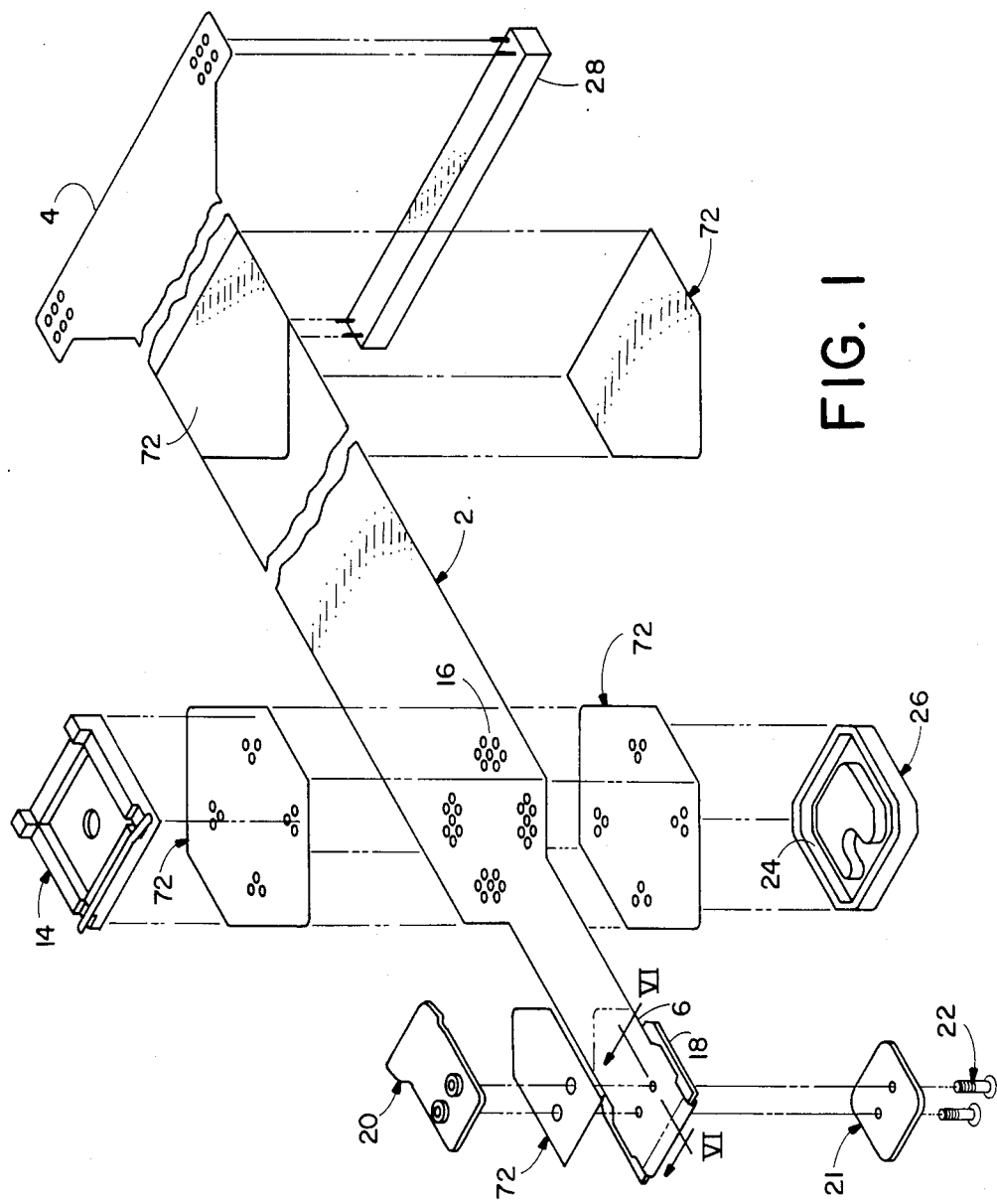
FIG. 1 is an exploded, perspective view of a probe cable assembly embodying the second aspect of the invention.

The probe cable assembly illustrated in the drawings comprises a flexible circuit board 2 having an instrument end 4 and a probe end 6. The flexible circuit board is made from three superimposed sheets 7, 8 and 9 of flexible dielectric material and two conductor layers sandwiched between the sheet 8 and the sheets 7 and 9 respectively. The sheet 8 is a base sheet of polyimide while the sheets 7 and 9 are cover sheets of dielectric material The two conductor layers form respective arrays of discrete conductor runs 10 and 12. The probe cable assembly also comprises a socket, or receptacle, 14 that is mounted to the flexible circuit board 2 in a chip support area 16, a stiffening member 18 of epoxy glass material about which the probe end of the flexible circuit board is folded, a strain relief member 20, a support plate 21, and screws 22 which serve to clamp the probe end of the flexible circuit board, with the stiffening member 18 attached thereto, between the strain relief member 20 and the support plate 21. The socket 14 is of conventional form complying with JEDEC standard MS-002 and may be, for example, a socket of the kind that is sold under Textool/3M part number 268-5400-00-1102. The socket comprises a square frame of dielectric material which carries 68 metal terminals around the internal periphery of the frame, with 17 terminals on each side of the frame. The terminals project from the underside of the socket as connecting pins (not shown). These pins extend through holes in the flexible circuit board, and enter a recess 24 in a cover plate 26 that is secured to the underside of the flexible circuit board. At its instrument end, the circuit board 2 is attached to a ZIF connector receptacle 2B such as that sold under AMP part number 87997-4. The logic analyzer's personality module is provided with a mating connector for receivino the receptacle 28.

As previously noted, the flexible circuit board has two arrays of conductor runs 10 and 12. The conductor runs 10 are ground conductors whereas the conductor runs 12 are signal conductors. Over the major part of the length of the probe cable assembly, the conductor runs extend generally parallel to one another and the two arrays of conductor runs are arranged in interlaced relationship. Thus, as shown in FIG. 4, each of the signal conductor runs 12 is substantially equidistant from two of the ground conductor runs 10 and, where the conductor runs are parallel, each ground conductor run is substantially equidistant from two signal conductor runs. There is no pair of runs comprising a signal run 12 and a ground conductor run 10, for which there is not an additional ground conductor run that is at substantially the same distance from the signal run as is the first-mentioned ground conductor run. Where it is necessary for the conductor runs 12 to diverge from parallelism, for example in order to facilitate passing the chip receiving area 16 (see the conductors 12c and 12d in FIG. 3), the ground conductor run that is equidistant from the two signal conductor runs at the adjacent edges of the diverging groups of conductor runs (the ground conductor run 10a) is divided into two conductor runs (10a' and 10a"). By this means, the signal conductor runs 12 and the ground conductor runs 10 form transmission lines of substantially uniform characteristic impedance over the length of the transmission lines. Therefore it is not necessary to provide a continuous ground plane.

The flexible circuit board is manufactured in conventional manner. The sheets 7, 8 and 9 are cropped to the desired configuration after the sheets have been secured together, but prior to such cropping the sheets 7, 8 and 9 are oversize and are formed with tooling holes (not shown) in the scrap areas. The cove sheet 9 is somewhat shorter than the sheets 7 and 8, terminating just hort of the square end region 43 of the flexible circuit board. The tooling holes aze used to locate the sheets relative to cutting dies that are used for stamping holes in the sheets. These holes comprise holes in all three sheets for passing the connecting pins of the socket 14 and for passing the screws 22, holes in the sheet 8 for interconnecting conductive areas on the opposite sides of the sheet 8, and holes in the sheet 7 for exposing contact pads on the same side of the sheet 8 as the ground conductor runs 10. After the holes have been cut, a continuous layer of copper is deposited over each main surfaoe of the base sheet 8. During the plating operation, copper is plated into the holes in the sheet 8, providing vias between areas of copper on the two main faces of the sheet. Copper is then removed bY conventional selective etching techniques so as to leave the desired areas of conductive material. Thereafter, the cover sheets 7 and 9 are placed over the tWo main surfaces of the sheet 8, and are secured to the areas of conductive material and to the exposed material of the substrate sheet S using a heat and pressure activated adhesive, such as an acrylic adhesive. The sheets are then cropped to size, and the flexible circuit board 2 results.

The signal conductor runs 12 are in two main groups. The first group comprises conductor runs that extend from the instrument end of the flexible circuit board to respective contact pads 42 at the probe end, and are also connected to corresponding pins of the socket 14. The second group, Which is much smaller, comprises conductor runs that extend from the instrument end to the probe end without being connected to pins of the socket 14. The third group, which also is much smaller than the first group, comprises conductor runs that extend between contact pads at the probe end of the cable and corresponding pins of the socket 14. At the instrument end of the flexible cable, the signal conductor runs of the first and second groups are exposed through holes in the cover sheet 9 and are soldered to respective pins of the connector 28. In the preferred embodiment of the invention, several of these pins are grounded through the personality module when the connector 28 is fitted to the complementary connector of the personality module.

The holes in the sheet B for passing the connecting pins of the socket 14 are smaller than the corresponding holes in the sheet 9, and each hole in the sheet 8 passes through a pad 70 of conductive material. Each of the pads 70 is therefore exposed through the corresponding hole in the sheet 9. In order to attach the socket 14 to the flexible circuit board, the pins are inserted through the holes in the sheets 7, 8 and 9, and the projecting ends of the pins are soldered to the exposed material of the pads 70. Most of the pads 70 are connected to one or more of the conductor runs 12, and therefore by soldering the pins to the exposed material of the pads 70, the terminals of the socket 14 become connected to the conductor runs 12.

The ground conductor runs 10 extend between a ground strip 34 at the instrument end of the flexible circuit board and a ground strip 36 at the probe end. The ground strip 34 is connected through vias in the sheet 8 to one or more of the conductor runs that are grounded through the personality module. Edge strips 40 on both sides of the sheet 8 are connected to the ground strip and are interconnected through vias.

The areas of conductive material that are exposed through holes in the sheet 7 include 6S contact pads 42 at the probe end of the flexible circuit board. The contact pads 42 are arranged along four sides of the square end region 43 of the flexible circuit board, with 17 pads along each side, and are gold plated. The strip 36 is connected to the contact pads 42a, and each of the other pads 42 is connected to one of the signal conductor runs 12. The connections between the pads 42 and the signal conductor runs are established by way of vias in the substrate sheet 8. In the case of the pads along the sides 50, 52 and 54 of the square end region 43, these vias extend immediately beneath the respective pads. However, along the side 56, there is insufficient space between the signal conductor runs, and therefore the vias for the conductor run 12f, for example, which is to be connected to the pad 42b, is formed at the interior of the square and a conductor run 64, on the same side of the substrate as the ground conductor runs 10, is used to connect the via to the pad 42b.

The stiffening member 18 is attached to the cover sheet 9 using acrylic adhesive, with the square end region 43 of the flexible circuit board extending beyond the stiffening member. The circuit board is then folded about the edge of the stiffening member, so that the square end region is brought underneath the stiffening member. The square end region is then attached to the underside of the stiffening member using a dielectric adhesive. Since the stiffening member 18 and the adhesive are both dielectric, the fact that the sheet 9 ends short of the square end region 43, and therefore leaves conductor runs 12 exposed over that region, does not affect the dielectric isolation of those conductor runs. The peripheral form of the stiffening member corresponds approximately to that of a leadless chip carrier in accordance with JEDEC standard MS-002, and therefore it also corresponds approximately to that Of the circuit element that is designed to be fitted in the socket 14. The layout of the contact pads 42 on the square end region of the flexible circuit board corresponds to the layout of the contact pads of the circuit element that is designed to be fitted in the socket 14. Thus, the combination of the stiffening member and the square end region 43 of the flexible circuit board forms a probe element that can be inserted into the receptacle of a SUT and will make contact with the terminals of the receptacle. The conductor runs that are connected to the contact pads of the probe element connect the SUT to the component fitted in the socket 14 and/or to the personality module.

The strain relief member 20 facilitates insertion of the probe element into, and removal of the of the probe element from, the receptacle of the system under test. HoWever, the strain relief member is not essential to all embodiments of the invention. Other strain relief and reinforcement members are shown in FIG. 1 at 72.

By providing for the contact pads of the probe element to be formed simply by exposed areas of the conductor runs of the flexible circuit, with appropriate plating, the need for solder joints in connecting the probe element to the conductor runs of the flexible circuit is avoided.

The interlaced arrangement of the signal conductor runs and the ground conductor runs presents a lower overall capacitance to the SUT when compared to a construction using a continuous ground plane, and provides a high degree of cross-talk immunity. Also, the flexible circuit board is less stiff than in the case of the prior probe cable assembly, and this leads to more ready manipulation of the probe end and a longer useful life for the flexible circuit board.

It will be appreciated that the the present invention is not restricted to the particular probe cable assembly that has been described and illustrated, and that variations may be made therein Without departing from the scope of the invention as defined in the appended claims, and equivalents thereof. For example, the above-mentioned first aspect of the invention may be used in applications other than probe cable assemblies, and the second aspect of the invention may be used with a continuous ground plane. Moreover, the present invention is not restricted to use with microprocessors, and may be used with other kinds of multiple terminal electronic components, such as gate arrays, and is not restricted to components having any particular pin count. Use of the invention with a leadless chip carrier having 68 contact pads has been described simply by way of example.

I claim:

1. A probe cable assembly for use in connecting a monitoring instrument to an electronic system under test, which system has a receptacle for receiving a multiple terminal electronic component, to analyze the interaction between the system and the component, said cable assembly comprising:

a flexible circuit cable having an instrument end for connection to the monitoring instrument and a probe end for connection to the receptacle of the electronic system under test, the cable having a plurality of conductors supported by a base sheet of dielectric material in mutually electrically insulated relationship with signal conductors and ground conductors being in interlaced relationship to form a plurality of transmission lines having a substantially uniform characteristic impedance over the length of the conductors, and having a cover sheet of dielectric material laminated to the base sheet with the conductors interposed between the cover sheet and the base sheet, at least one group of conductors terminating at the probe end in respective termination areas that lie in a predetermined array, the termination areas being exposed at one side of the cable and forming respective terminals for the conductors of said group;

a stiffening element attached to the cable at the probe end on the opposite side of the cable from said one side, said stiffening element being capable of fitting into the receptacle of the system under test; and an auxiliary receptacle for receiving the multiple terminal electronic component, said auxiliary receptacle being secured to the cable and having a plurality of contact elements in a predetermined array, and also having terminal pins connected to the contact elements and extending through the base sheet and being connected to conductors to said one group.

2. A probe cable assembly according to claim 1, comprising a second cover sheet of dielectric material laminated to the opposite side of the base sheet from the first-mentioned cover sheet, there being a second group of conductors interposed between the second cover sheet and the base sheet, the first group of conductors being the signal conductors and the second group of conductors being the ground conductors in interlaced relationship with the signal conductors.

3. A probe cable assembly according to claim 2, wherein the termination areas are exposed through respective holes in the second cover sheet, said termination areas being connected to conductor runs of the first group of conductor runs by way of vias extending through the base sheet.

4. A probe cable assembly according to claim 1, wherein the base sheet has first and second opposite main faces and the cover sheet is laminated to the first main face of the base sheet, said termination areas being exposed at said second main face of the cover sheet and being connected to the conductors of said one group by way of vias extending through the base sheet.

5. A probe cable assembly according to claim 1, wherein the base sheet has first and second opposite main faces and the cover sheet is laminated to the first main face of the base sheet, the termination areas are exposed at the second main face, the base sheet lies between the conductors and the auxiliary receptacle, the cover sheet lies between the conductors and the stiffening element, and the flexible circuit cable has an end region in which the termination areas lie, said end region being folded around the stiffening element.

6. A probe cable assembly to connect a test instrument to a system under test having an electrical component in a receptacle comprises:

an elongate flexible circuit board having a probe end for connection to the receptacle of the system under test in lieu of the electrical component and an instrument end for connection to the test instrument, the elongate flexible circuit board comprising a dielectric base sheet, a plurality of signal conductors mounted on one face of the dielectric base sheet running between the instrument end and the probe end, a plurality of ground conductors mounted on the opposing face of the dielectric base sheet, the ground conductors being interconnected to each other and running substantially parallel to and interlaced with the signal conductors so that the ground conductors are equidistant between adjacent signal conductors to form transmission lines of substantially uniform characteristic impedance, means at the probe end for electrically connecting the signal conductors to respective terminal pads, and dielectric covers sandwiching the dielectric base sheet and the conductors therebetween, the dielectric cover on the signal conductor side not including the probe end; and a dielectric stiffener element mounted on the signal conductor side of the flexible circuit board adjacent the probe end, the probe end of the flexible circuit board being folded over the dielectric stiffener element such that the probe end is capable of fitting into the receptacle to establish electrical contact between the terminal pads and the system under test.

7. A probe assembly for use in connecting a monitoring instrument to an electronic system under test, which system has a receptacle for receiving a multiple terminal electronic component, to analyze the interaction between the system and the component, said cablel assembly comprising:

a flexible circuit cable having an instrument end for connection to the monitoring instrument and a probe end for connection to the receptacle of the electronic system under test;

the flexible circuit cable being constructed of a dielectric material with a plurality of conductors supported bgy the dielectric material in mutually electrically insulated relationship, said conductors having signal conductors and ground conductors being in interlaced relationship to form a plurality of transmission lines having a substantially uniform characteristic impedance over the length of the conductors with at least one group of conductors terminating at said probe end in respective termination areas that lie in a predetermined array, said termination areas being exposed at one side of the cable and forming respective terminals for the conductors of said group; and the cable further having a stiffening element attached to the cable at its probe end at the opposite side of the cable from said one side, the probe end of the cable with the termination areas being folded over the stiffening element, said stiffening element being capable of fitting in the receptacle of the system under test so that the respective terminals contact corresponding terminals in the receptacle.

8. A probe cable assembly according to claim 7, wherein the flexible circuit cable is generally flat in form and comprises a base sheet of dielectric material and a cover sheet of dielectric material laminated to the base sheet with the conductors interposed between the cover sheet and the base sheet.

* * * * *